(12) United States Patent
Ling

(10) Patent No.: US 9,571,885 B2
(45) Date of Patent: Feb. 14, 2017

(54) METHOD AND APPARATUS FOR AN ENERGY-EFFICIENT RECEIVER

(71) Applicant: MaxLinear, Inc., Carlsbad, CA (US)

(72) Inventor: Curtis Ling, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 14/719,393

(22) Filed: May 22, 2015

(65) Prior Publication Data
US 2015/0326916 A1    Nov. 12, 2015

Related U.S. Application Data

(63) Continuation of application No. 14/274,890, filed on May 12, 2014, now Pat. No. 9,042,851, which is a
(Continued)

(51) Int. Cl.
H04H 20/74    (2008.01)
H04N 21/436   (2011.01)
(Continued)

(52) U.S. Cl.
CPC ..... *H04N 21/43615* (2013.01); *H03M 1/1205* (2013.01); *H04B 1/16* (2013.01);
(Continued)

(58) Field of Classification Search
CPC .......... H04H 40/90; H04H 20/74; H04N 7/20; H04B 7/18513; H04B 7/18523; H04B 1/40; H04B 1/3822; H04B 1/406; H04B 1/44; H04B 1/54; H04B 1/26; H04B 1/005; H03J 5/244; H03J 5/242; H03D 7/161
(Continued)

(56) References Cited

U.S. PATENT DOCUMENTS 7,136,618 B2 * 11/2006 Kato ............... H04H 40/90
                                             455/194.2
8,725,104 B2  5/2014 Ling
(Continued)

FOREIGN PATENT DOCUMENTS

EP      1494353 A3     1/2006
WO   2009143082 A1    11/2009
WO   2011033342 A1     3/2011

OTHER PUBLICATIONS

European Search Report for EP 12003194 dated Aug. 24, 2012.

*Primary Examiner* — Nhan Le
(74) *Attorney, Agent, or Firm* — McAndrews, Held & Malloy, Ltd.

(57) ABSTRACT

One or more circuits may comprise at least one first-type analog-to-digital converter (ADC) and at least one second-type ADC. The circuit(s) may be operable to receive a plurality of signals, each of which may comprise a plurality of channels. The circuit(s) may be operable to digitize a selected one or more of the channels. Which, if any, of the selected channels are digitized via the at least one first-type ADC and which, if any, of the selected channels are digitized via the at least one second-type ADC, may be based on which of the plurality of channels are the selected channels and/or based on power consumption of the circuit(s). A bandwidth of each first-type ADC may be on the order of the bandwidth of one of the received signals. A bandwidth of each second-type ADC may be on the order of the bandwidth of one of the plurality of channels.

20 Claims, 18 Drawing Sheets

Related U.S. Application Data continuation of application No. 13/356,265, filed on Jan. 23, 2012, now Pat. No. 8,725,104.

(60) Provisional application No. 61/569,731, filed on Dec. 12, 2011.

(51) Int. Cl.

| | |
|---|---|
| *H04N 21/61* | (2011.01) |
| *H04N 21/426* | (2011.01) |
| *H04N 21/462* | (2011.01) |
| *H04N 21/442* | (2011.01) |
| *H04H 40/90* | (2008.01) |
| *H04H 60/82* | (2008.01) |
| *H04N 7/20* | (2006.01) |
| *H03M 1/12* | (2006.01) |
| *H04B 1/16* | (2006.01) |

(52) U.S. Cl.
CPC ............ *H04H 40/90* (2013.01); *H04H 60/82* (2013.01); *H04N 7/20* (2013.01); *H04N 21/42607* (2013.01); *H04N 21/44227* (2013.01); *H04N 21/462* (2013.01); *H04N 21/6143* (2013.01)

(58) Field of Classification Search
USPC ............... 455/3.02, 77, 161.1, 168.1, 179.1, 180.1,455/182.1, 188.1, 189.1, 190.1, 313, 323, 334
See application file for complete search history.

(56) References Cited

U.S. PATENT DOCUMENTS

| | | |
|---|---|---|
| 2002/0003586 A1 | 1/2002 | Busson et al. |
| 2002/0154055 A1 | 10/2002 | Davis et al. |
| 2004/0058642 A1* | 3/2004 | Merio ............... H03J 1/0083 455/3.02 |
| 2006/0262222 A1 | 11/2006 | Monnier et al. |
| 2008/0060024 A1 | 3/2008 | Decanne |
| 2008/0112385 A1* | 5/2008 | Bargroff ............. H04B 1/28 370/343 |
| 2009/0007189 A1 | 1/2009 | Gutknecht et al. |
| 2009/0113492 A1 | 4/2009 | Norin et al. |
| 2010/0303181 A1 | 12/2010 | Yu |
| 2011/0231157 A1 | 9/2011 | Alley et al. |

\* cited by examiner

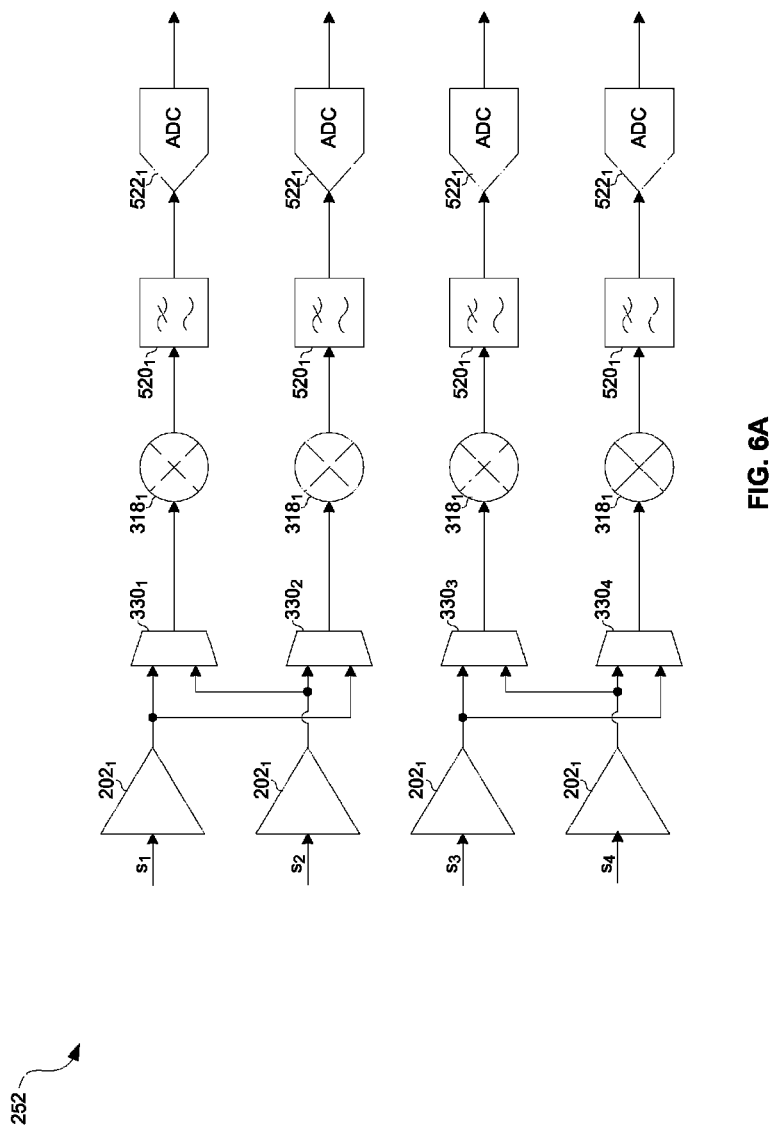

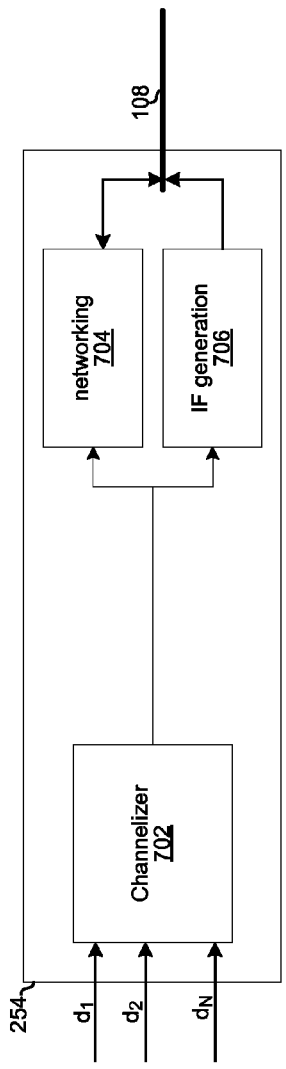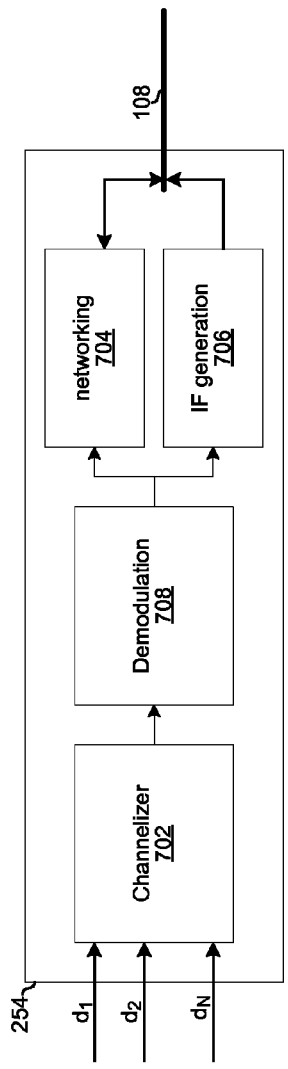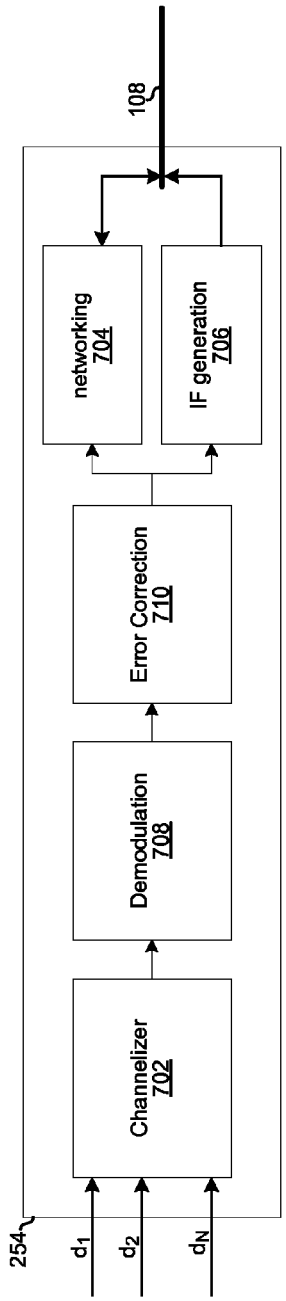

METHOD AND APPARATUS FOR AN ENERGY-EFFICIENT RECEIVER

CLAIM OF PRIORITY

This patent application is a continuation of U.S. application Ser. No. 14/274,890 now U.S. Pat. No. 9,042,851, which is a continuation of U.S. application Ser. No. 13/356,265 now U.S. Pat. No. 8,725,104 and makes reference to, claims priority to and claims benefit from U.S. Provisional Patent Application Ser. No. 61/569,731 entitled "Method and Apparatus for an Energy-Efficient Receiver" and filed on Dec. 12, 2011.

The above-referenced application is hereby incorporated herein by reference in its entirety.

INCORPORATION BY REFERENCE

This patent application also makes reference to:
U.S. Patent Application Provisional Ser. No. 61/487,979 entitled "Efficient Architecture for Broadband Receivers" filed on May 19, 2011;
U.S. patent application Ser. No. 12/762,900 entitled "Wideband Tuner Architecture" filed on May 5, 2011 and now U.S. Pat. No. 8,526,898;
U.S. patent application Ser. No. 13/326,125 entitled "System and Method in a Broadband Receiver for Efficiently Receiving and Processing Signals" filed on Dec. 14, 2011; and now published as 2012/0297427; and
U.S. patent application Ser. No. 13/301,400 entitled "Method and System for Providing Satellite Television Service to a Premises" filed on Nov. 21, 2011 and now published as 2012/0297426;

Each of the above-referenced applications is hereby incorporated herein by reference in its entirety.

FIELD OF THE INVENTION

Certain embodiments of the invention relate to signal processing. More specifically, certain embodiments of the invention relate to a method and apparatus for an energy-efficient receiver.

BACKGROUND OF THE INVENTION

Conventional receivers are too big and/or consume too much power. Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for an energy-efficient receiver, substantially as illustrated by and/or described in connection with at least one of the figures, as set forth more completely in the claims.

These and other advantages, aspects and novel features of the present invention, as well as details of an illustrated embodiment thereof, will be more fully understood from the following description and drawings.

BRIEF DESCRIPTION OF THE DRAWINGS

FIGS. 6A-6D illustrates another exemplary intermediate frequency (IF) processing module that enables seamless transitions between different channels.

FIGS. 7A-7C illustrate exemplary embodiments of a digital processing module of an IP-LNB.

DETAILED DESCRIPTION OF THE INVENTION

As utilized herein the terms "circuits" and "circuitry" refer to physical electronic components (i.e. hardware) and any software and/or firmware ("code") which may configure the hardware, be executed by the hardware, and or otherwise be associated with the hardware. As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$. As utilized herein, the terms "block" and "module" refer to functions than can be implemented in hardware, software, firmware, or any combination of one or more thereof. As utilized herein, the term "exemplary" means serving as a non-limiting example, instance, or illustration. As utilized herein, the terms "for example" and "e.g.," introduce a list of one or more non-limiting examples, instances, or illustrations.

Figure 1:
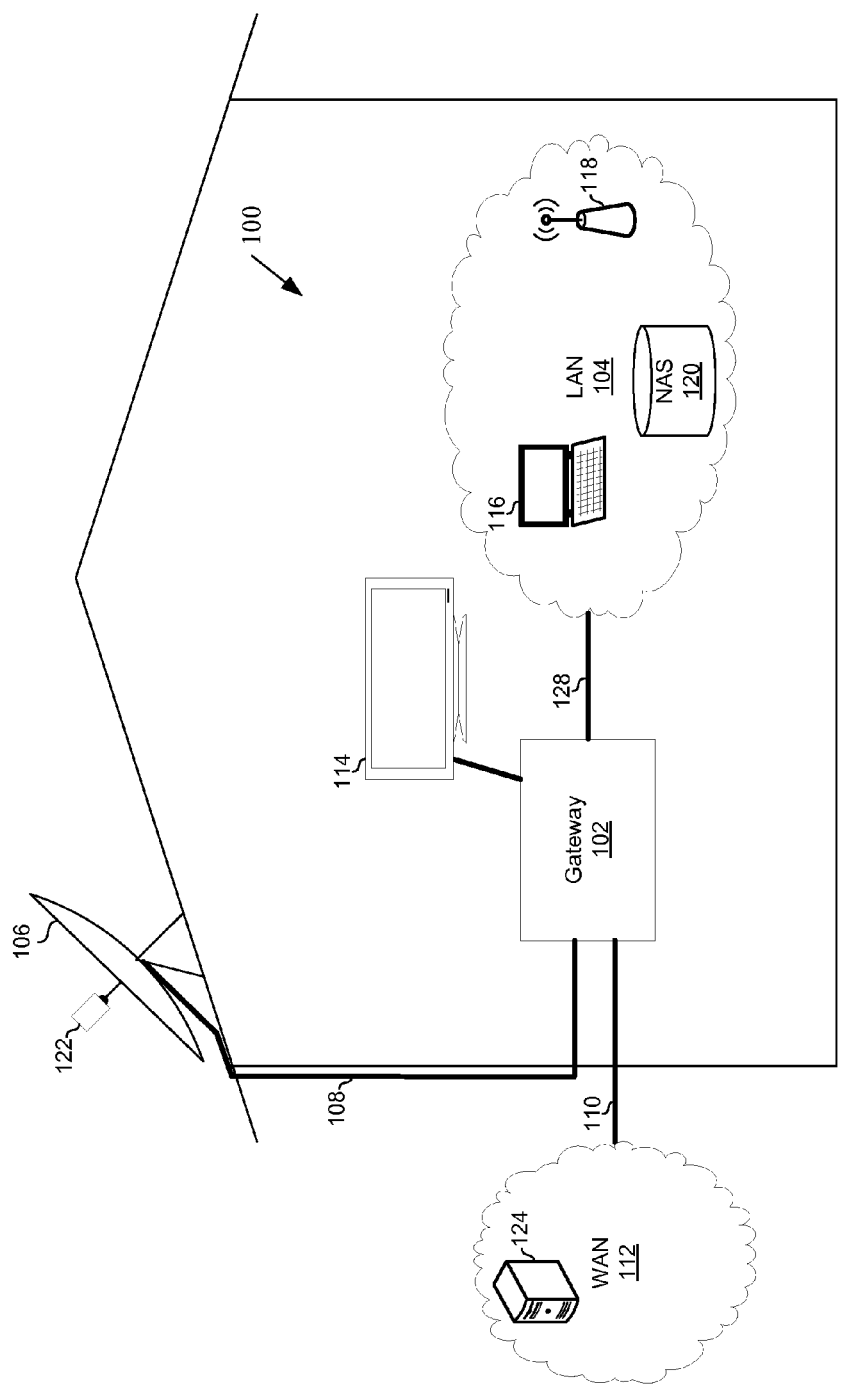
FIG. 1 depicts an exemplary network comprising satellite television components, local area networking components, and wide area networking components.

FIG. 1 depicts an exemplary network comprising satellite television components, local area networking components, and wide area networking components. As shown in FIG. 1, the system 100 comprises an exemplary in-premises network 100, a satellite dish 106 comprising a module 122, a wide area network (WAN) 112 comprising one or more servers 124, a network link 108 connecting the dish 106 and the in-premises network 100, and a link 110 connecting the in-home network 100 and the WAN 112. The exemplary in-home network 100 comprises a gateway 102, television 114, and a local area network (LAN) 104.

The satellite dish 106 may comprise circuitry operable to receive satellite signals and output the received signals to the gateway 102 via the communication link 108. The satellite dish 106 may, for example, comprise the Internet Protocol (IP) low noise block-downconverter (LNB) 122 described below with respect to FIGS. 2A and 2B.

Each of the communication links 108 and 110 may comprise one or more wired, wireless, and/or optical links. The communication link 108 may comprise, for example, a coaxial cable and/or a 60 GHz wireless link which carries physical layer symbols in accordance with, for example, Multimedia over Coax Alliance (MoCA) or Ethernet standards. The communication link 110 may comprise, for example, a coaxial cable or Cat-5e cable which carries physical layer symbols in accordance with, for example, DSL or Ethernet standards.

The gateway 102 may comprise circuitry operable to receive satellite signals, process the received signals to recover data, and output the data to an end-user device such as the television 114. The gateway 102 may also comprise circuitry operable to transmit and/or receive data over the communication links 110, 128, and/or 108. Communications over the link 128 and/or 108 may be in accordance with, for example, Multimedia over Coax Alliance (MoCA) and/or Ethernet standards. Communication over the link 100 may be in accordance with, for example, CATV/DOCSIS or DSL standards. The gateway 102 may, for example, be a stand-alone unit or may be integrated with a television set-top box (STB) or other device of the network 100.

The television 114 may comprise circuitry operable to receive media and control data via one or more point-to-point media links (e.g., HDMI), process the received data to recover audio and/or video, and present the audio and/or video to a viewer.

The WAN 112 may comprise, for example, a DSL (or cable) headend and associated circuitry and/or devices. Such devices may include one or more servers 124 which are operable to communicate with the gateway 102 to communicate general IP traffic and/or to communicate control information pertaining to satellite television communications. For example, the server 124 may establish a secure connection to the gateway 102 to exchange security keys for decrypting and/or descrambling signals received via the dish 106. The communication link between a satellite television content provider and the network 100 via the satellite dish 106 and communication link 108 may, for example, be completely or partially independent of the WAN and communication link 110.

The LAN 104 may comprise any number and/or type of networking devices. Exemplary devices shown include a computer 116, network attached storage 120, and a wireless access point (WAP) 118. The devices of the LAN 104 may communicate utilizing, for example, MoCA and/or Ethernet protocols.

In operation, the dish 106 may receive one or more satellite television signals, each of which may be comprised of one or more channels. The signals may be processed by the IP-LNB 122 and/or gateway 102 to recover one or more of the channels carried in the received signals. Which signals are processed by one or more components of the IP-LNB 122 and/or gateway 102 may be determined based on which channels are selected for consumption (e.g., which television channels are selected for viewing) by one or more devices of the network 100 (e.g., the television 114). The processing of the received signal(s) to recover the selected channel(s) may comprise downconverting and amplifying the received one or more signals to generate a corresponding one or more intermediate frequency (IF) signals. The IF signals may then be processed via one or more of a plurality of signal paths, where different ones of the signal paths may have different characteristics (e.g., different paths may have different bandwidths and power consumption). Each of the signal paths may comprise, for example, a mixer, a filter, and an analog-to-digital converter (ADC). Which one or more paths are utilized for processing which IF signals may be determined based on which channels are the selected channels. The selection of which signal paths are utilized for recovering each of the selected channels may be performed with a goal of reducing the amount of power required to recover the selected channels.

Figure 2A:
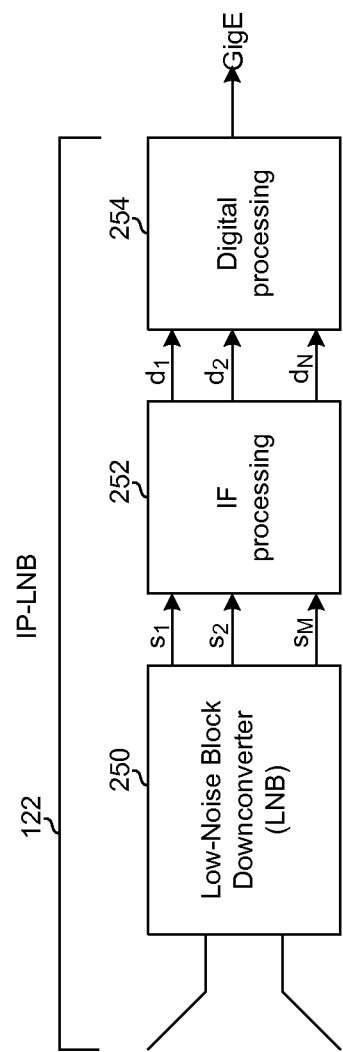
FIG. 2A depicts an exemplary Internet Protocol low-noise block-downconverter (IP-LNB).

FIG. 2A depicts exemplary circuitry collocated with a satellite dish. The transceiver module 122, referred to herein as IP-LNB 122, comprises a low-noise block-downconverter (LNB) 250, an IF processing module 252, and a digital processing module 254. The LNB 250, IF processing module 252, and digital processing module 254 may, for example, be integrated on a common substrate (e.g., a single silicon die).

The LNB 250 may comprise circuitry operable to receive RF satellite signals, and filter and amplify such signals to generate corresponding IF signals. The LNB 250 is illustrated outputting M (an integer number) of IF signals, labeled $s_1$ to $s_M$. Each of such IF signals may, for example, comprise IF signals in the 950 MHz to 2150 MHz range, each of which may correspond to a respective satellite signal (e.g., a satellite television signal).

The IF processing module 252 may comprise circuitry operable to amplify, downconvert, filter, and/or digitize at least a portion of the IF signals $s_1$-$s_M$ to generate digital signals $d_1$-$d_N$, where N is an integer. The portion(s) of the signals $s_1$ to $s_M$ that are digitized may depend on which channels in the signals $s_1$ to $s_M$ are selected by one or more devices of the network 100. In this regard, the IF processing module 252 may be configured based on which channels in the signals $s_1$ to $s_M$ are selected by one or more devices of the network 100. The configuration of the IF processing module 252 may be performed to optimize power consumption versus performance of the IF processing module 252. The IF processing module 252 may be configured via one or more control signals from the digital processing module 254. Additional details of the IF processing module 252 are described below with respect to FIG. 2B.

The digital processing module 254 may comprise circuitry operable to process the signals $d_1$-$d_N$ to recover one or more channels contained in the signals $d_1$-$d_N$. For example, each of the signals $d_1$-$d_N$ may comprise one or more 6 MHz (or 8 MHz) television channels and some guard band. As another example, each of the signals $d_1$-$d_N$ may comprise one or more 20-45 MHz satellite channels and some guard band. The digital processing module 254 may, for example, perform DC offset calibration, I/Q mismatch calibration, channelization, demodulation, error correction, and/or any other digital processing operation necessary and/or desirable for processing the signals $d_1$-$d_M$ to recover one or more selected channels.

The digital processing module 254 may also comprise circuitry operable to packetize data recovered from the one or more selected channels (e.g., one or more MPEG transport streams recovered from the selected channels), and transmit the packets onto the link 108 utilizing one or more networking protocols. In an exemplary embodiment, the packetized data may be transmitted onto the link 108 utilizing Internet Protocol (IP) and/or Gigabit Ethernet.

The digital processing module 254 may also comprise circuitry operable to provide control signals to the LNB 250 and/or the IF processing module 252. Exemplary control signals include: one or more signals to control a frequency of one or more local oscillators in the LNB 250 and/or the IF processing module 252; one or more signals to control a gain of one or more amplifiers in the LNB 250 and/or the IF processing module 252; one or more signals to control a frequency response of one or more filters in the LNB 250 and/or the IF processing module 252; and/or one or more signals to control a sample rate of one or more ADCs in the LNB 250 and/or the IF processing module 252.

Figure 2B:
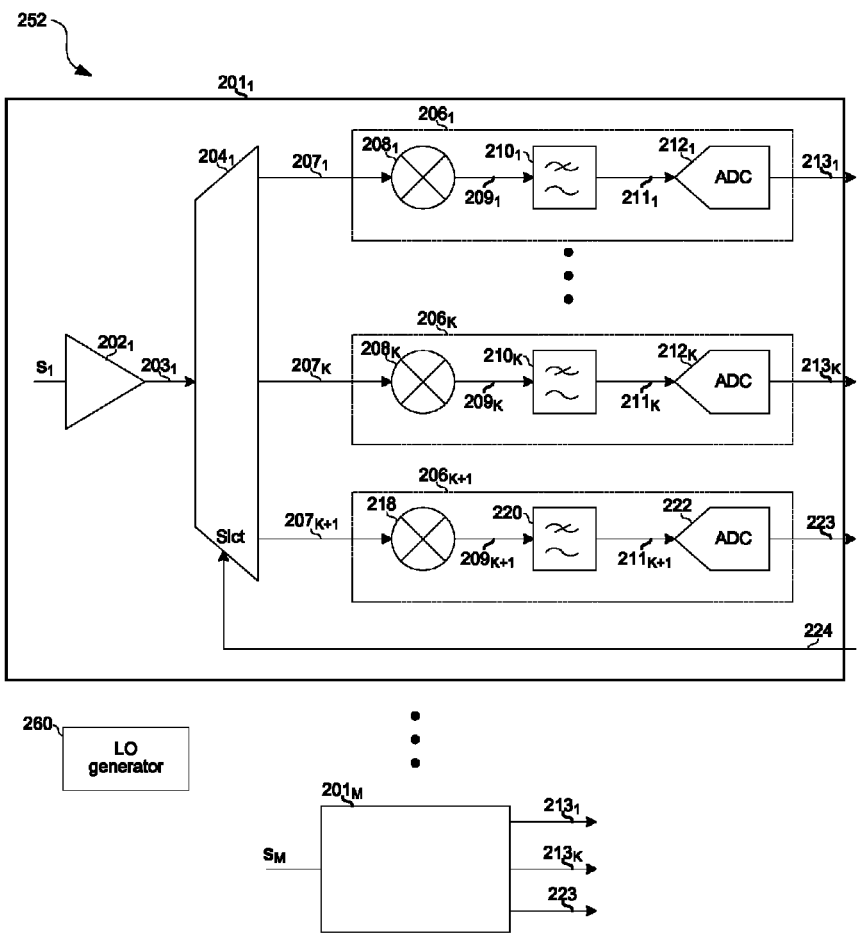
FIG. 2B depicts an exemplary intermediate frequency (IF) processing module of a satellite television system.

FIG. 2B depicts an exemplary intermediate frequency (IF) processing module of a satellite television system. The exemplary IF processing module 252 comprises modules $201_1$-$201_M$, where M is an integer (if M=1, then there would be only one module 201) corresponding to the maximum number of received satellite signals that the IF module 252 can concurrently process. Each module $201_m$ (where m is an integer less than or equal to M) comprises an amplifier $202_m$, a multiplexer $204_m$, receive paths $206_1$-$206_{K+1}$ (where K is an integer). Each of the paths $206_1$-$206_K$ (where k is an integer less than or equal to K) comprises a mixer $208_k$, a filter $210_k$, and an ADC $212_k$. The path $206_{K+1}$ comprises a mixer 218, a filter 220, and an ADC 222. In an exemplary embodiment, the paths $206_1$-$206_K$ may be "narrowband paths" comprising lower-bandwidth components, and the path $206_{K+1}$ may be a "wideband path" comprising higher-bandwidth components. In an exemplary embodiment of the invention, the narrowband paths may be operable to process signals having a bandwidth of approximately 6 or 8 MHz (the bandwidth of a television channel). In an exemplary embodiment of the invention, the narrowband paths may be operable to process signals having a bandwidth of approximately 20-45 MHz (the bandwidth of a satellite channel). In an exemplary embodiment of the invention, the broadband paths may be operable to process signals having a bandwidth of approximately 1 GHz (e.g., the 950-2150 MHz band often used as the IF band in a satellite television receiver).

Each amplifier $202_m$ may comprise circuitry operable to amplify and/or buffer the IF signal $s_m$ to generate the signal $203_m$. In an exemplary embodiment, each of the amplifiers $202_m$ may be configurable between two modes of operation: a "wideband mode" in which it provides at least a threshold amount of gain over a larger bandwidth (e.g., 1.2 GHz), and a "narrowband mode" in which it provides at least a threshold amount of gain over a smaller bandwidth (e.g., 6, 8, or 20, or 45 MHz).

The multiplexer $204_m$ may comprise circuitry operable to route the signal $203_m$ to one or more of the paths $206_1$-$206_{K+1}$. Which of the paths $206_1$-$206_{K+1}$ the signal $203_m$ is routed to may be controlled by the signal 224 and may depend on which channels of the signal $203_m$ have been requested by devices of the network 100.

Each mixer $208_k$ may comprise circuitry operable to mix the signal $207_k$ with a local oscillator signal (not shown) to generate the signal $209_k$. In an exemplary embodiment, the mixer 208k may be an I/Q mixer which mixes the signal $207_k$ with a pair of phase-quadrature local oscillator signals to generate a pair of phase-quadrature signals $209_k$. The mixer 218 may function similarly to the mixers $208_1$-$208_K$, but may have different characteristics. For example, the mixer 218 may have higher bandwidth and correspondingly higher power consumption than each of the mixers $208_1$-$208_K$. The phase and/or frequency of local oscillator signals (not shown) input to the mixers $208_1$-$208_K$ and 218 may be controlled via one or more signals from the digital processing module based on which one or more channels of one or more of the signals $s_1$-$s_M$ have been selected for consumption.

Each filter $210_k$ may comprise circuitry operable to filter out undesired frequencies from the signal $209_k$ to generate the signal $211_k$. The filter 220 may function similarly to the mixers $210_1$-$210_K$, but may have different characteristics. For example, the filter 220 may have higher bandwidth and correspondingly higher power consumption than each of the filters $210_1$-$210_K$.

Each ADC $212_k$ may comprise circuitry operable to convert the analog signal $211_k$ (which may be two quadrature-phase signals) into the digital signal $213_k$. The ADC 222 may function similarly to the ADCs $212_1$-$212_K$, but may have different characteristics. For example, the ADC 222 may have higher bandwidth and correspondingly higher power consumption than each of the ADCs $212_1$-$212_K$.

In operation, j channels of the signal $s_m$ may be selected for consumption by devices of the network 100. If j<K, the signal 224 may configure the multiplexer $204_m$ to route the signal $203_m$ to each of signal paths $206_1$-$206_j$ while the components of signal paths $206_{j+1}$-$206_{K+1}$ are powered down. If j=K, the signal 224 may configure the multiplexer $204_m$ to route the signal $203_m$ to each of signal paths $206_1$-$206_K$ while the components of signal paths $206_{K+1}$ are powered down. If j>K, the signal 224 may configure the multiplexer $204_m$ to route the signal $203_m$ to the signal path $206_{K+1}$ while the components of signal paths $206_1$-$206_K$ are powered down. The value of K may be determined based on the point where power consumption of the narrowband paths becomes greater than power consumption of the broadband path. That is, the power consumption of K narrowband paths concurrently processing signals may be less than the power consumption of one broadband signal processing a signal, but K+1 narrowband paths concurrently processing signals may consume more power than one broadband processing path.

For each module $201_1$-$201_M$, one or more of the signals $213_1$-$213_K$ and 223 may be output as a corresponding one or more of the signals $d_1$-$d_N$ shown in FIG. 2A, where the value of N depends on which channels are selected. To illustrate, in an exemplary embodiment in which M=4 and K=3, five channels may be selected from signal $s_1$, and three channels may be selected from signal $s_M$. In such an embodiment, the signal 223 of module $201_1$ may be output as signal $d_1$, signals $213_1$-$213_3$ of module $201_M$ may be output as signals $d_2$-$d_4$, respectively, and thus N=4 in such an exemplary embodiment.

The IF module 252 also comprises a local oscillator (LO) generator 260 which may be operable to generate one or more LO signals and route those one or more LO signals to one or more of the mixers $208_1$-$208_K$ and 218. The LO generator 260 may comprise, for example, one or more crystals, one or more direct digital synthesizers, and/or one or more phase-locked loops.

FIGS. 3A-3D depicts another exemplary intermediate frequency (IF) processing module of a satellite television system. The embodiment of the IF processing module 252 shown in FIGS. 3A-3D may function similar to, but have a different architecture than, the embodiment of the IF processing module 252 shown in FIG. 2. In this regard, FIGS. 3A-3D depict an exemplary embodiment in which M=4, and which comprises modules $302_1$-$302_4$, each of which comprises a mixer 208 and a mixer 318, multiplexers $330_1$-$330_2$ and $332_1$-$332_4$, filters $220_1$-$220_2$ and $210_1$-$210_4$, ADCs $222_1$-$222_2$ and $212_1$-$212_4$, and LO generator 360.

The LO generator 360 may be operable to generate one or more LO signals and route those one or more LO signals to one or more of the mixers 208 and 218. The LO generator 360 may comprise, for example, one or more crystals, one or more direct digital synthesizers, and/or one or more phase-locked loops.

Each of the mixers 208 in FIGS. 3A-3D may be the same as any one of the mixers $208_1$-$208_K$ described with respect to FIG. 2B, for example. Each of the filters $220_1$-$220_2$ in FIGS. 3A-3D may be the same as the filter 220 described with respect to FIG. 2B, for example. Each of the filters $210_1$-$210_4$ in FIGS. 3A-3D may be the same as any one of the mixers $210_1$-$210_K$ described with respect to FIG. 2B, for example. Each of the ADCs $212_1$-$212_4$ in FIGS. 3A-3D may be the same as any one of the ADCs $212_1$-$212_K$ described with respect to FIG. 2B, for example. Each of the ADCs $222_1$-$222_2$ in FIGS. 3A-3D may be the same as the ADC 222 described with respect to FIG. 2B, for example.

Each of the mixers 318 may be similar to the mixer 218 described with respect to FIG. 2B, for example. Each of the mixers 318 may be configurable into multiple configurations, with different configurations being characterized by, for example, different power consumption and bandwidth. In an exemplary embodiment, each of the mixers 318 may be configurable between two modes of operation: a "wideband mode" in which it downconverts all, or substantially all of the IF bandwidth (e.g., 950-2150 MHz), and a "narrowband mode" in which it downconverts only a portion of the IF bandwidth (e.g., one 6, 8, 20, 30, or 45 MHz portions of the IF bandwidth).

The configuration of the multiplexers $330_1$-$330_2$ and $322_1$-$322_4$ determines which of the mixers 208 and 218 are coupled to which of the filters $210_1$-$210_4$ and $220_1$-$220_2$. The multiplexers $330_1$-$330_2$ and $322_1$-$322_4$ may be configured via one or more control signals (not shown) from the digital processing module 254 based on which channels of the signals $s_1$-$s_4$ are selected for consumption and based on power consumption.

In operation, the modules $302_1$-$302_4$ may be configured based on which channels for which one or more of the signals $s_1$-$s_4$ are selected for consumption. Such configuration may include powering up one or more of the mixers 208 and/or 318, configuring a mode of one or more of the mixers 318, and configuring a frequency of one or more LO signals generated by the LO generator 260. The multiplexers $330_1$-$330_2$ and $332_1$-$332_4$ may also be configured based on which channels of which one or more of the signals $s_1$-$s_4$ are selected for consumption. Such configuration may comprise selecting which multiplexers $330_1$-$330_2$ are powered up and, for each powered-up multiplexer, which input is coupled to the output.

Figure 3A:
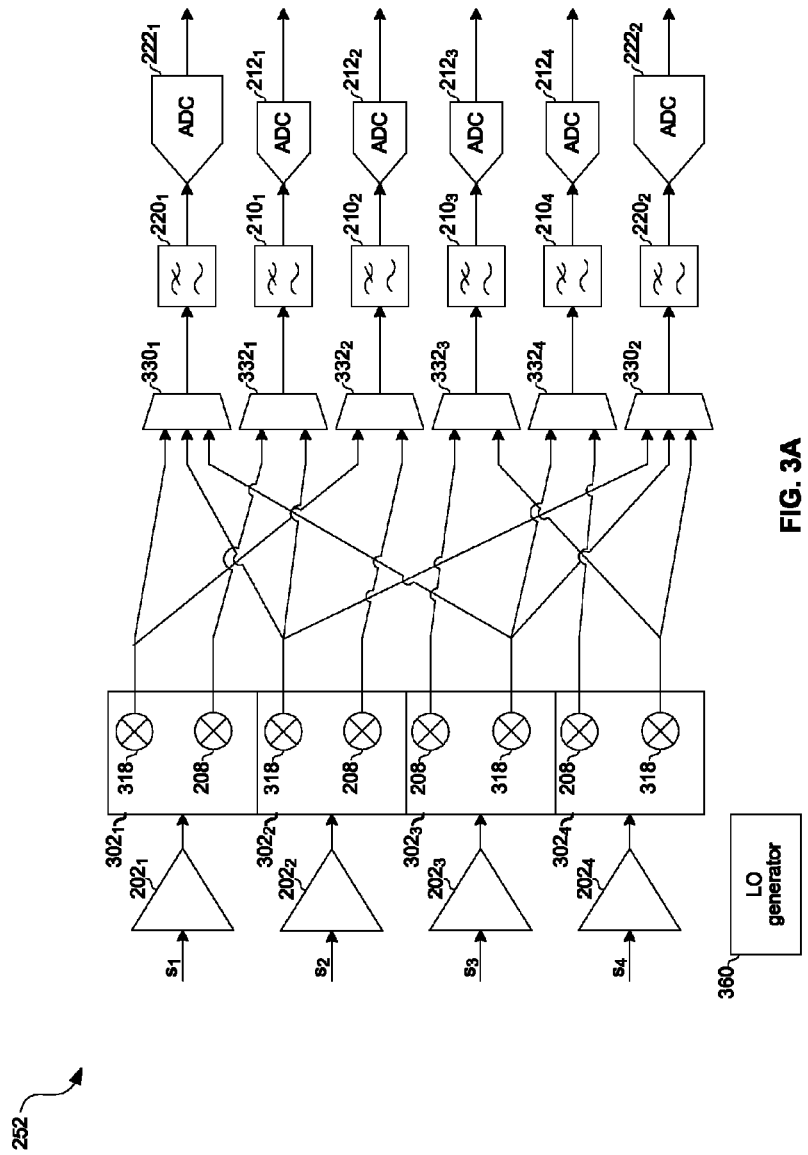
FIGS. 3A-3D depicts another exemplary intermediate frequency (IF) processing module of a satellite television system.
Figure 3B:
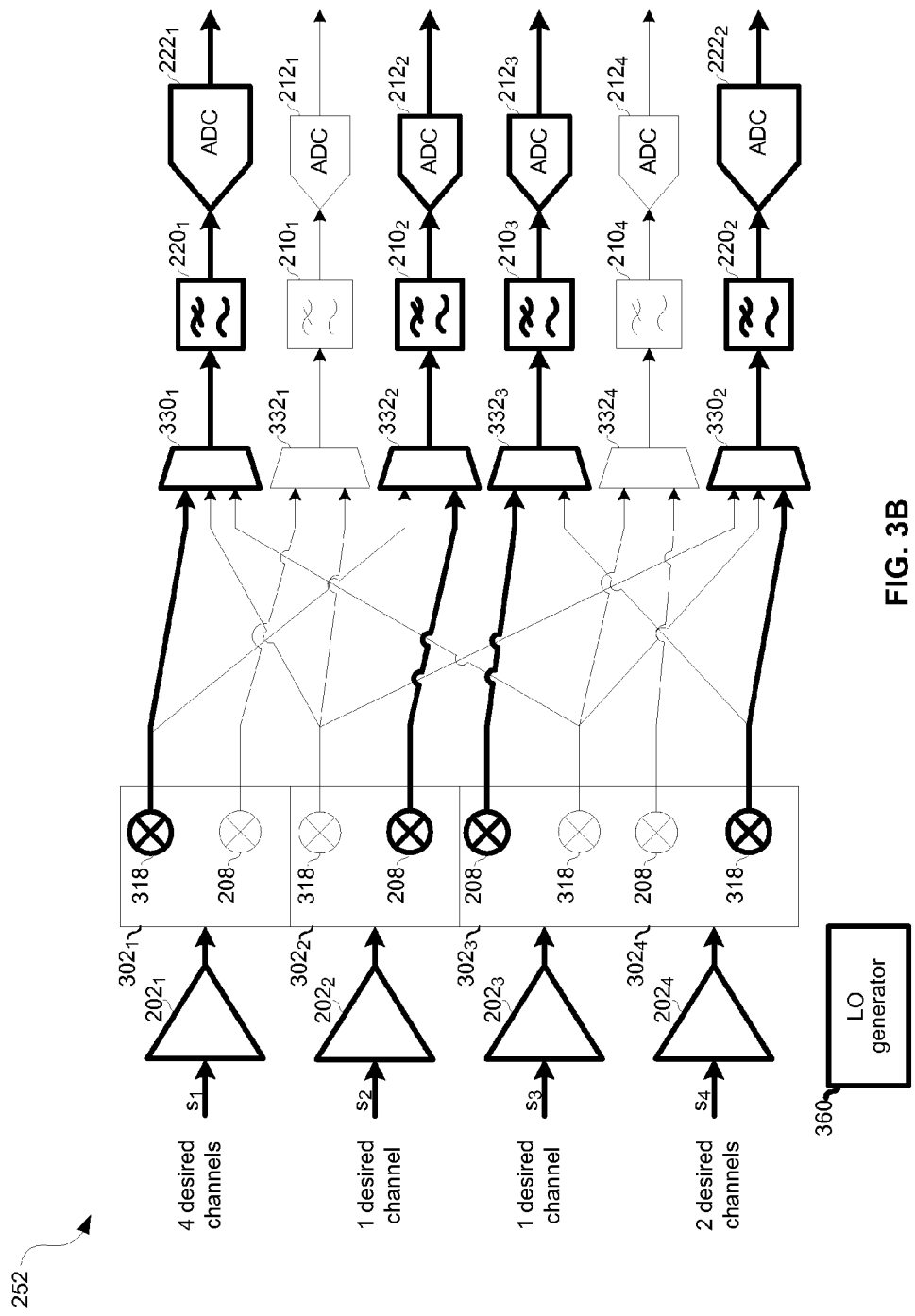

Referring to FIG. 3B, there is shown a configuration of the IF module 252 which enables recovering four channels from signal $s_1$, one channel from each of signals $s_2$ and $s_3$, and two channels from signal $s_4$. In FIG. 3B, the IF module 252 is configured such that powered-up components are (shown in bold in the figure): amplifiers $202_1$-$202_4$, mixer 318 of each of modules $302_1$ and $302_2$, mixer 208 of each of modules $302_2$ and $302_3$, multiplexers $330_1$, $330_2$, $332_2$, $332_3$, filters $220_1$, $220_2$, $210_2$, $210_3$, ADCs $222_1$, $222_2$, $212_2$, $212_3$, and at least a portion of the LO generator 260. Other components in FIG. 3B may be in a low-power state.

Figure 3C:
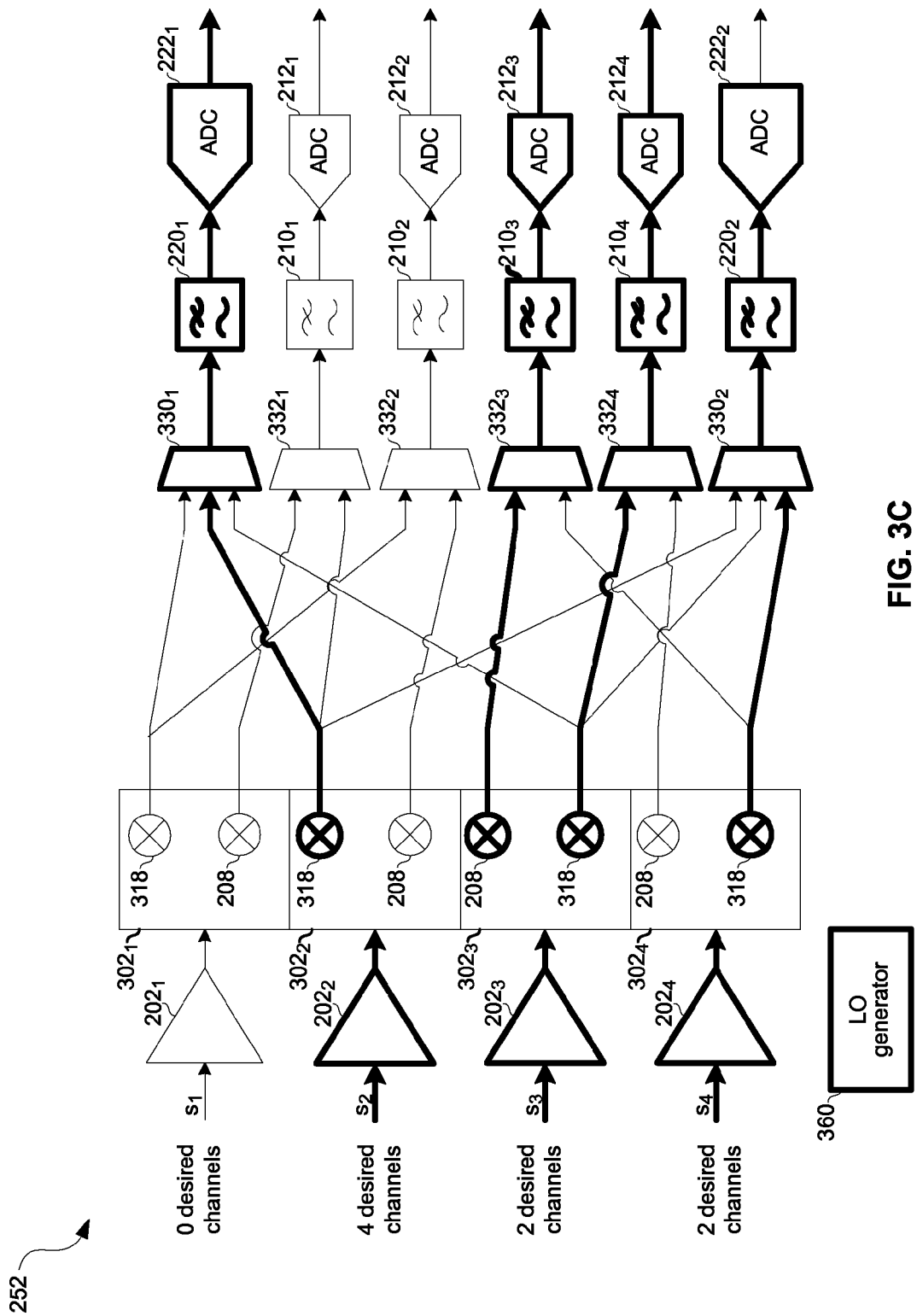

Referring to FIG. 3C, there is shown a configuration of the IF module 252 which enables recovering four channels from signal $s_2$ and two channels from each of signals $s_3$ and $s_4$. In FIG. 3C, the IF module 252 is configured such that powered-up components are (shown in bold in the figure): amplifiers $202_2$-$202_4$, mixer 318 of each of modules $302_2$-$302_4$, mixer 208 of module $302_3$, multiplexers $330_1$-$330_2$ and $332_3$-$332_4$, filters $220_1$-$220_2$ and $210_3$-$210_4$, ADCs $222_1$-$222_2$ and $212_3$-$212_4$, and at least a portion of the LO generator 260. Other components in FIG. 3C may be in a low-power state.

Figure 3D:
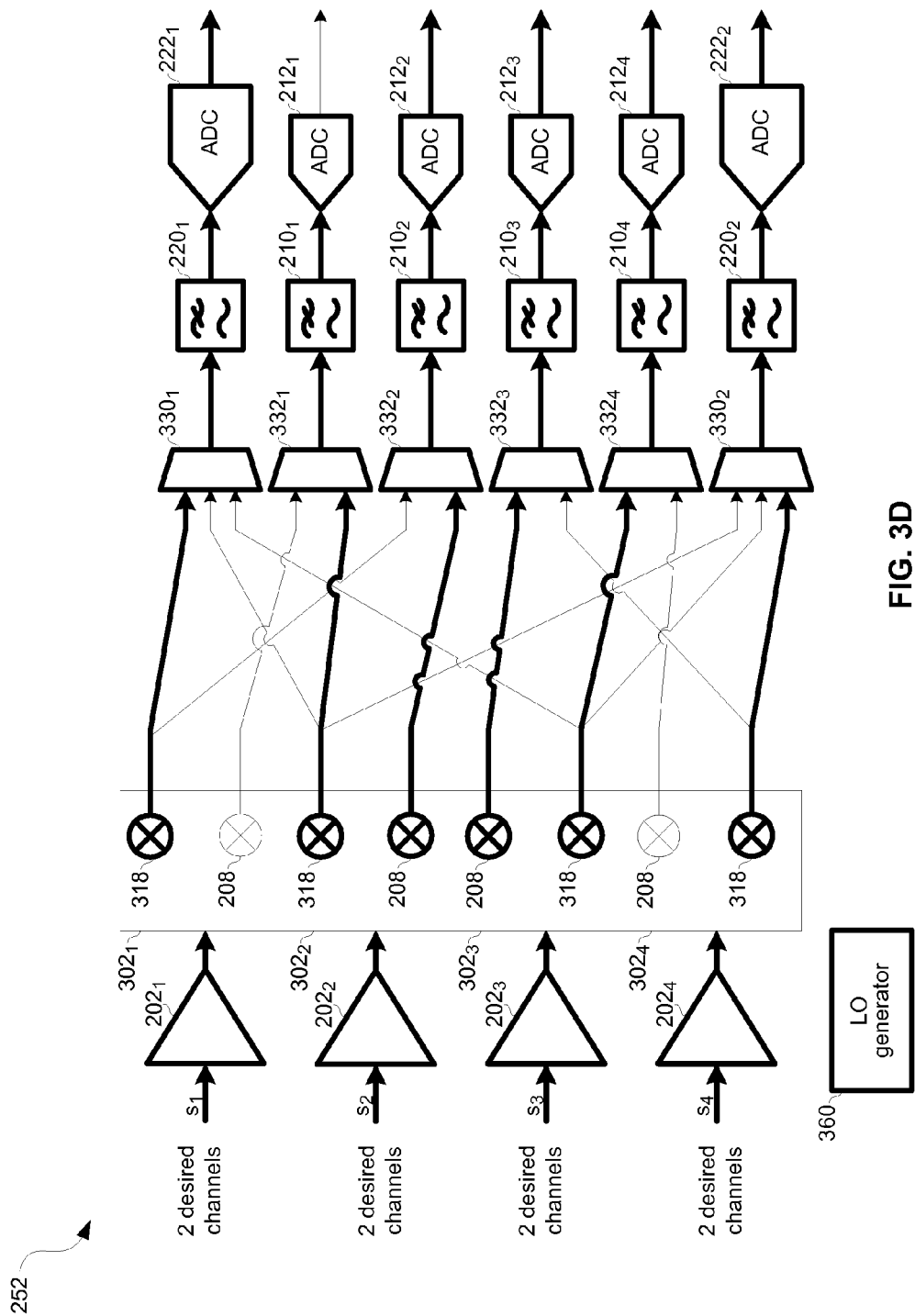

Referring to FIG. 3D, there is shown a configuration of the IF module 252 which enables recovering two channels from each of signals $s_1$-$s_4$. In FIG. 3D, the IF module 252 is configured such that powered-up components are (shown in bold in the figure): amplifiers $202_1$-$202_4$, mixer 318 of each of modules $302_1$-$302_4$, mixer 208 of each of modules $302_2$ and $302_3$, multiplexers $330_1$-$330_2$ and $332_1$-$332_4$, filters $220_1$-$220_2$ and $210_1$-$210_4$, ADCs $222_1$-$222_2$ and $212_1$-$212_4$, and at least a portion of the LO generator 260.

FIGS. 4A-4D illustrate operation of an exemplary IF processing module during a change in which channels are selected for consumption. The embodiment of the IF processing module 252 shown in FIGS. 4A-4D may function similar to, but have a different architecture than, the embodiment of the IF processing module 252 shown in FIG. 2. In this regard, FIGS. 4A-4D depict an exemplary embodiment in which M=4, K=4, and which comprises modules $402_1$-$402_4$, each of which comprises four mixers 208 and a mixer 218, multiplexers $330_1$-$330_8$ and 430, filters $210_1$-$210_8$ and 220, ADCs $212_1$-$212_8$ and 222, and LO generator 460.

The LO generator 460 may be operable to generate one or more LO signals and route those one or more LO signals to one or more of the mixers 208 and 218. The LO generator 360 may comprise, for example, one or more crystals, one or more direct digital synthesizers, and/or one or more phase-locked loops.

Figure 4A:
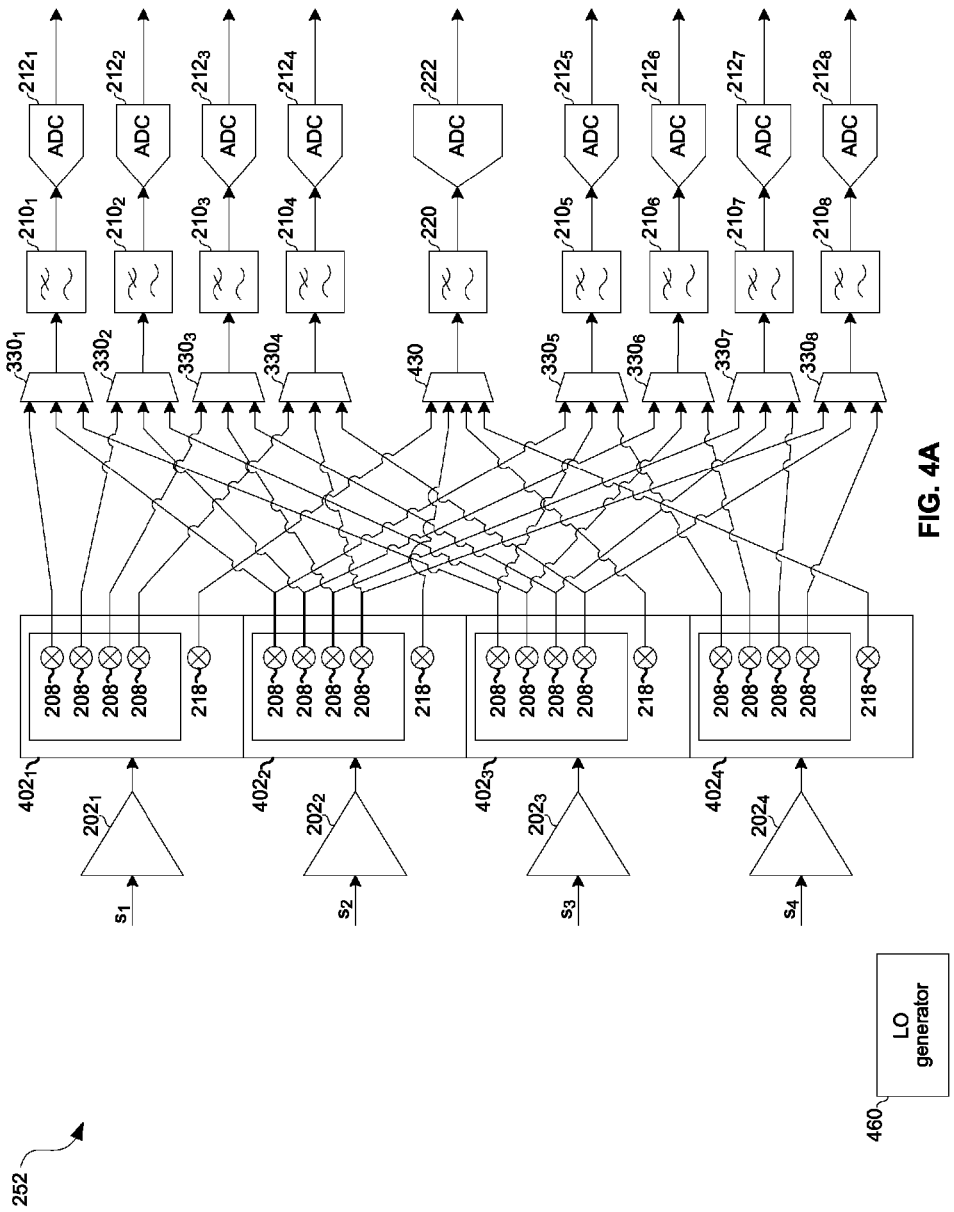
FIGS. 4A-4D illustrate operation of an exemplary IF processing module during a change in which channels are selected for consumption.

Each of the mixers 208 in FIG. 4A may be the same as any one of the mixers $208_1$-$208_K$ described with respect to FIG. 2B, for example. Each of the mixers 218 in FIG. 4A may be the same as the mixer 218 described with respect to FIG. 2B, for example. Each of the filters $210_1$-$210_8$ in FIG. 4A may be the same as any one of the filters $210_1$-$210_K$ described with respect to FIG. 4A, for example. The filter 220 in FIG. 4A may be the same as the filter 220 described with respect to FIG. 2B, for example. Each of the ADCs $212_1$-$212_8$ in FIG. 4A may be the same as any one of the ADCs $212_1$-$212_K$ described with respect to FIG. 2B, for example. The ADC 222 in FIG. 4A may be the same as the ADC 222 described with respect to FIG. 2B, for example.

The multiplexers $330_1$-$330_8$ and 430 determine which of the mixers 208 and 218 are coupled to which of the filters $210_1$-$210_8$ and 220. The multiplexers $330_1$-$330_8$ and 340 may be configured via one or more control signals (not shown) from the digital processing module 254 based on which channels of the signals $s_1$-$s_4$ are selected for consumption and/or based on power consumption of the IF module 252.

Figure 4B:
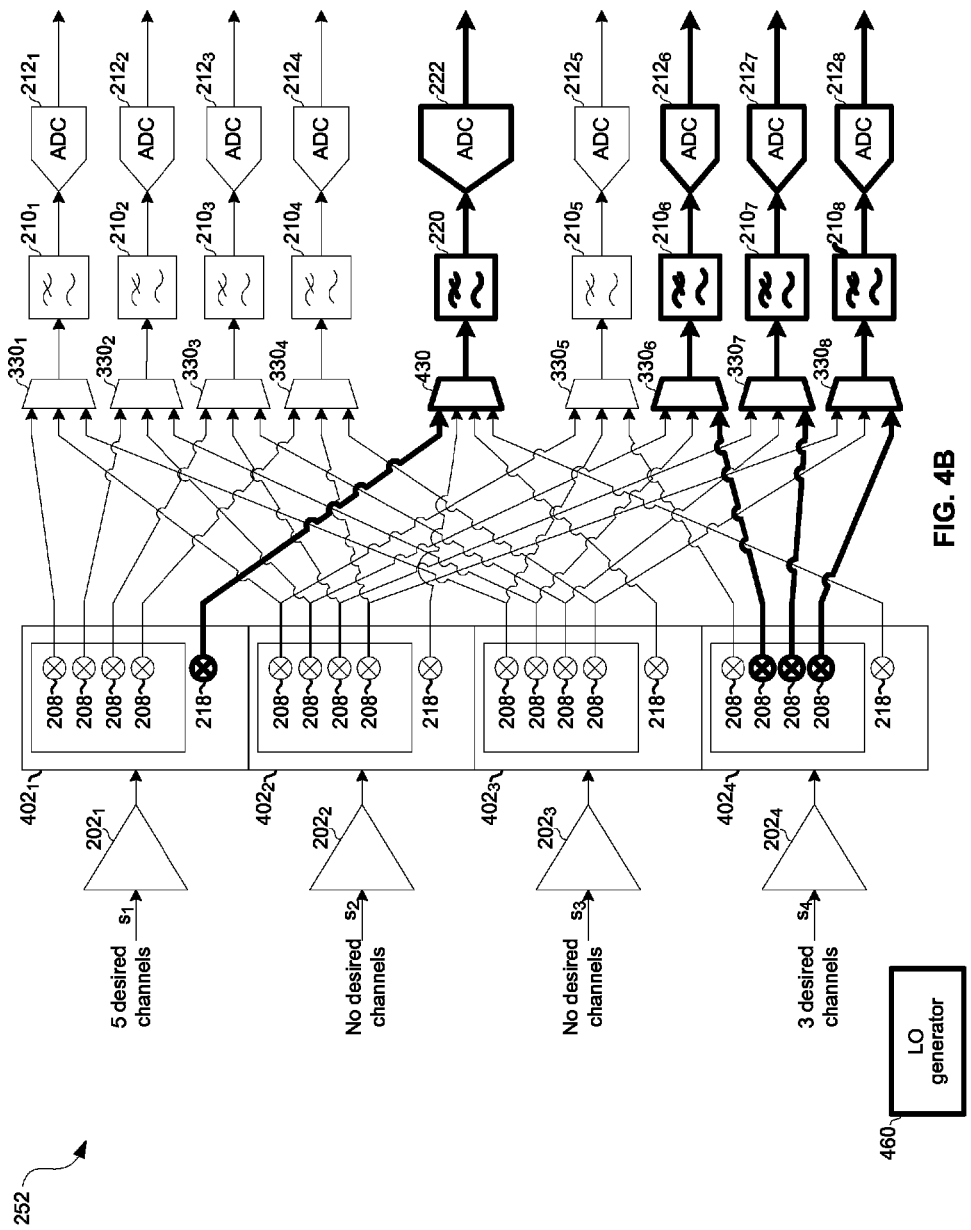

In FIG. 4B the IF processing module 252 is configured to enable recovery of five selected channels from the signal $s_1$ and three selected channels from the signal $s_4$. Because more than four channels from signal $s_1$ are selected for consumption, it may be more power-efficient to process the signal $s_1$ via a wideband signal path comprising the mixer 218 of the module $402_1$, the multiplexer 430, the filter 420, and the ADC 422 (as compared to processing the signal via five narrowband paths comprising five mixers 208, five filters 210, and five ADCs 212). The signal $s_4$, on the other hand, is processed via three narrowband paths, each path comprising a mixer 208 of the module $402_4$, a multiplexer 330, a filter 210, and an ADC 212.

Figure 4C:
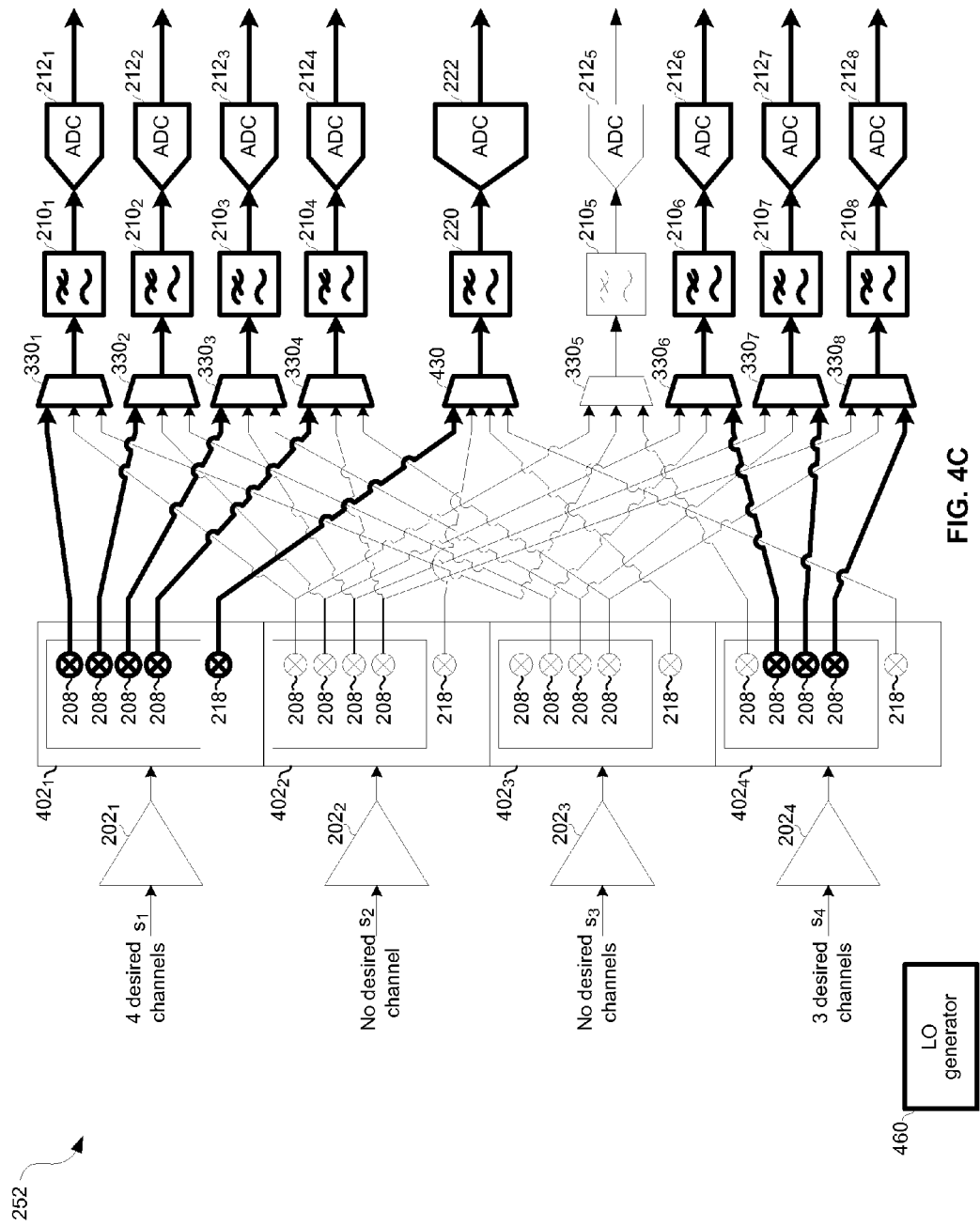
Figure 4D:
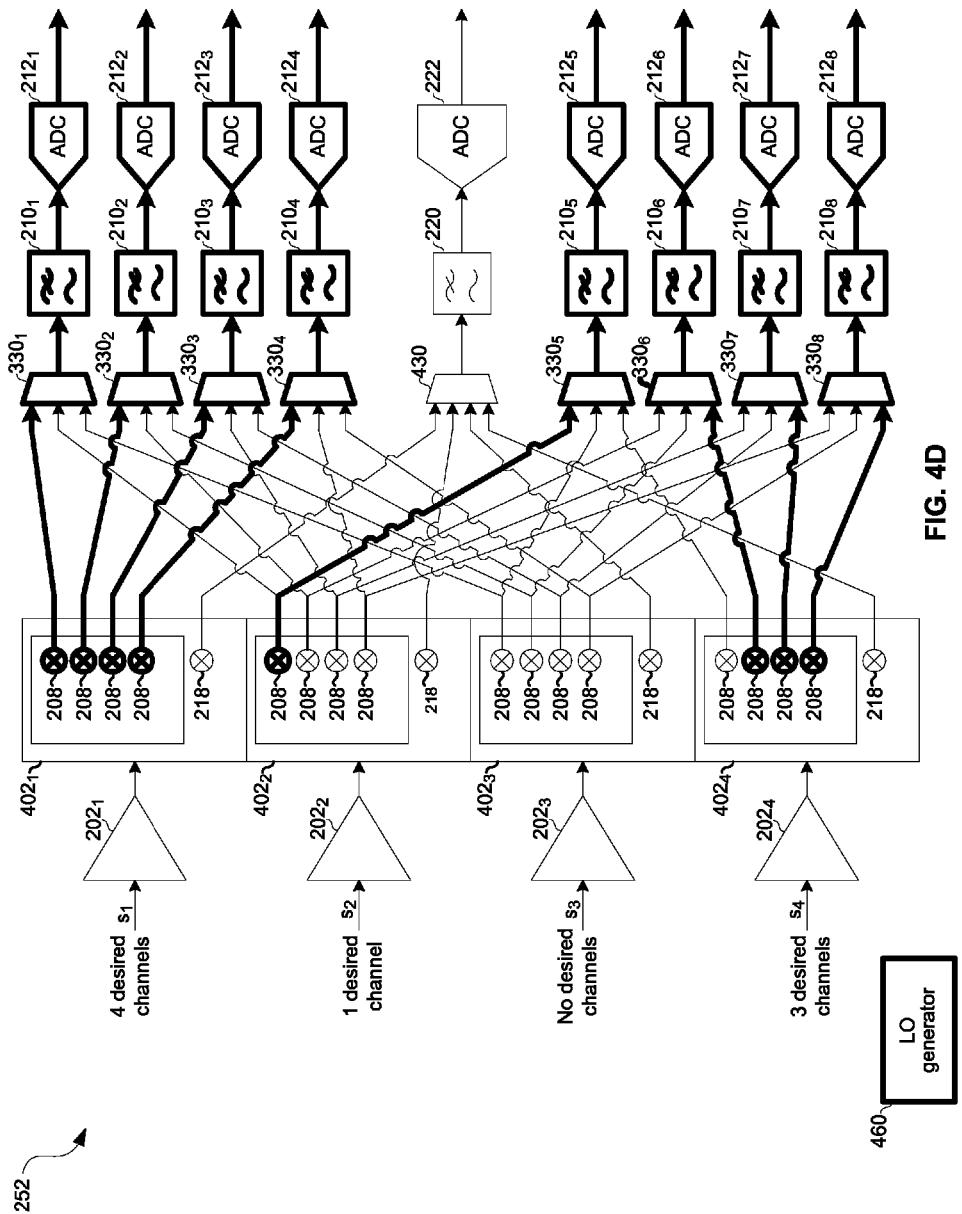

While the device is configured as shown in FIG. 4B, a change in selected channels may occur. For example, in FIG. 4B the television 114 may be consuming one of the five channels from signal $s_1$ but may desire to switch to a channel of signal $s_2$. In order to prevent disturbing the other channels that are being consumed, the IF module 252 may utilize a "make before break" method when reconfiguring the IF module. In this regard, as shown in FIG. 4C, the IF module 252 may be configured to recover the four selected channels from $s_1$ via the four narrowband paths comprising mixers 208 of module $402_1$, multiplexers $330_1$-$330_4$, filters $210_1$-$210_4$, and ADCs $212_1$-$212_4$, while still processing $s_1$ via the wideband path comprising mixer 418 of module $402_1$, multiplexer 430, filter 220, and ADC 222. Once the selected channels of $s_1$ are ready via the four narrowband paths, the digital processing module 254 can seamlessly switch from the wideband path to the four narrowband paths without losing any of the content on the selected channels. Once the switch is complete, as shown in FIG. 4D, the wideband path can be powered down and the narrowband path comprising a mixer 408 of module 402$_2$, multiplexer 330$_5$, filter 210$_5$, and ADC 212$_5$ can be powered up to make the selected channel from s$_2$ available to the digital processing module 254.

Figure 5:
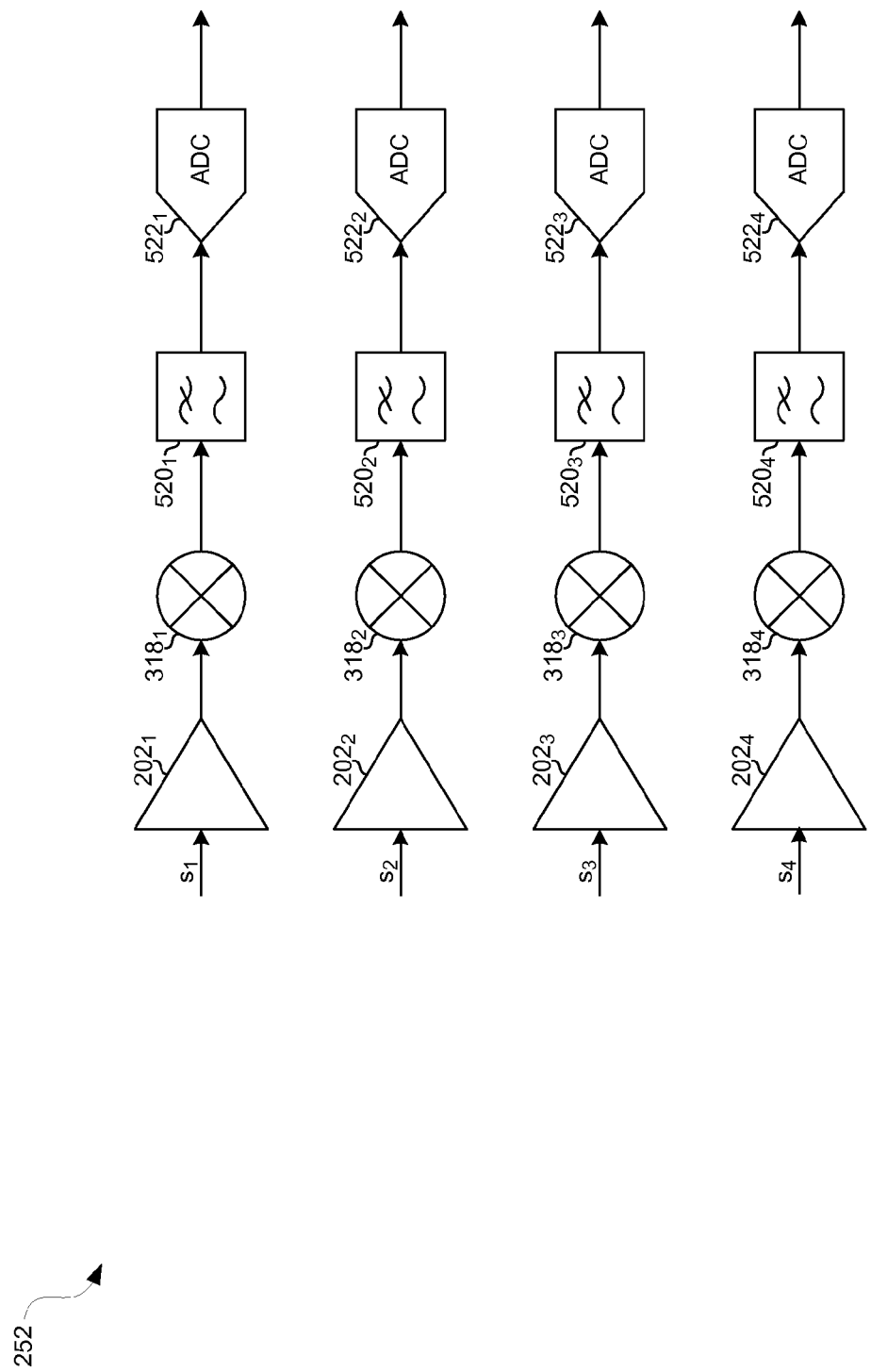
FIG. 5 illustrates another exemplary intermediate frequency (IF) processing module of a satellite television system.

FIG. 5 illustrates another exemplary intermediate frequency (IF) processing module of a satellite television system. The IF module 252 depicted in FIG. 5 comprises amplifiers 202$_1$-202$_4$, mixers 318$_1$-318$_4$, filters 520$_1$-520$_4$, and ADCs 522$_1$-522$_4$.

Each of the amplifiers 202$_1$-202$_4$ may be the same as one of the amplifiers 202$_1$-202$_M$ described with respect to FIG. 2B. Each of the mixers 318$_1$-318$_4$ may be the same as one of the mixers 318 described with respect to FIGS. 3A-3D.

Each of the filters 510$_1$-510$_4$ may comprise circuitry operable to filter out undesired frequencies from an input signal to generate an output signal. In an exemplary embodiment, each of the filters 510$_1$-510$_4$ may be configurable between two modes of operation: a "wideband mode" in which it provides at least a threshold amount of attenuation outside a larger bandwidth (e.g., 1.2 GHz), and a "narrowband mode" in which it provides at least a threshold amount of attenuation outside a smaller bandwidth (e.g., one 6, 8, 20, 30, or 45 MHz channel).

Each of the ADCs 522$_1$-522$_4$ may comprise circuitry operable to convert an analog signal (which may be two quadrature-phase signals) into a digital signal. In an exemplary embodiment, each of the ADCs 522$_1$-522$_4$ may be configurable between two modes of operation: a "wideband mode" in which it is operable to digitize a wide bandwidth signal (e.g., 1.2 GHz), and a "narrowband mode" in which it is operable to digitize a narrow bandwidth (e.g., one 6, 8, 20, 30, or 45 MHz channel).

In operation, for each signal s$_m$ which carries one or more selected channels, the components 202$_m$, 318$_m$, 520$_m$, and 522$_m$ may be powered up and configured into an appropriate mode of operation based on how many selected channels are carried in the signal s$_m$. For example, if only one channel is selected from the signal s$_m$, then each of the components 202$_m$, 318$_m$, 520$_m$, and 522$_m$ may be configured into a mode of operation suitable for handling a 6 (or 8, 20, or 45 MHz) channel. Similarly, if more channels are selected from the signal s$_m$, then each of the components 202$_m$, 318$_m$, 520$_m$, and 522$_m$ may be configured into a mode of operation having a correspondingly wider bandwidth. In an exemplary embodiment, the power consumption of the components may increase with increased bandwidth. For a channel s$_m$ not carrying any selected channels, the components 202$_m$, 318$_m$, 520$_m$, and 522$_m$ may be powered down or otherwise configured into a low-power mode.

FIGS. 6A-6D illustrates another exemplary intermediate frequency (IF) processing module that enables seamless transitions between different channels. The embodiment of the IF module 252 shown in FIGS. 6A-6D may be the same as the embodiment shown in FIG. 5, but may additionally comprise multiplexers 330$_1$-330$_4$, each of which may be the same as one of the multiplexers 330$_1$-330$_2$.

Figure 6B:
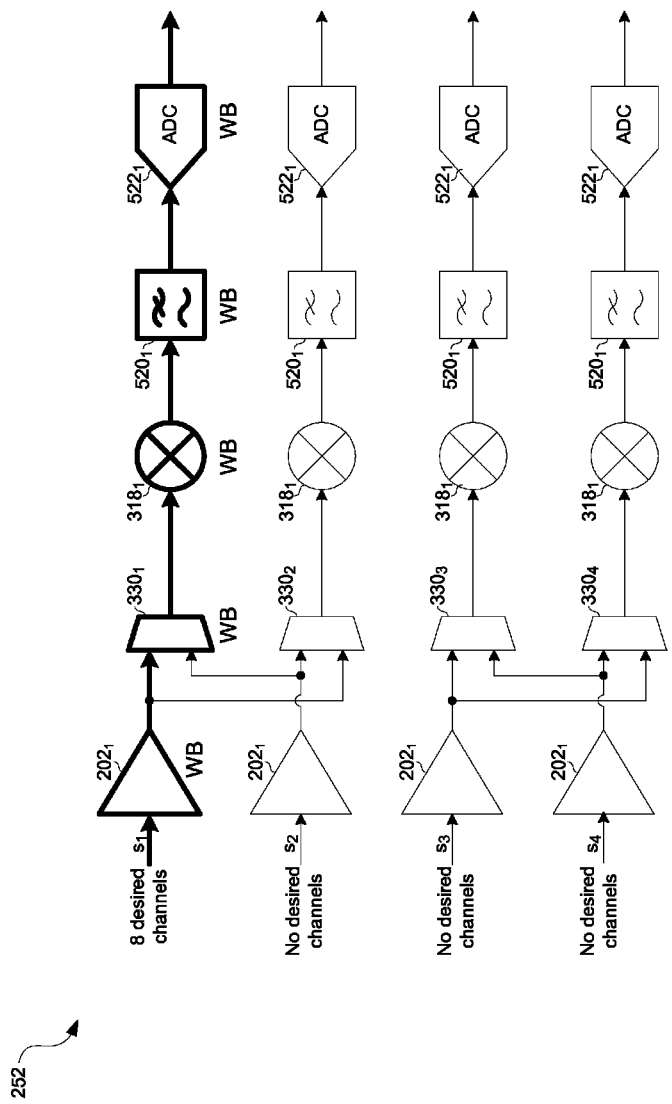
Figure 6C:
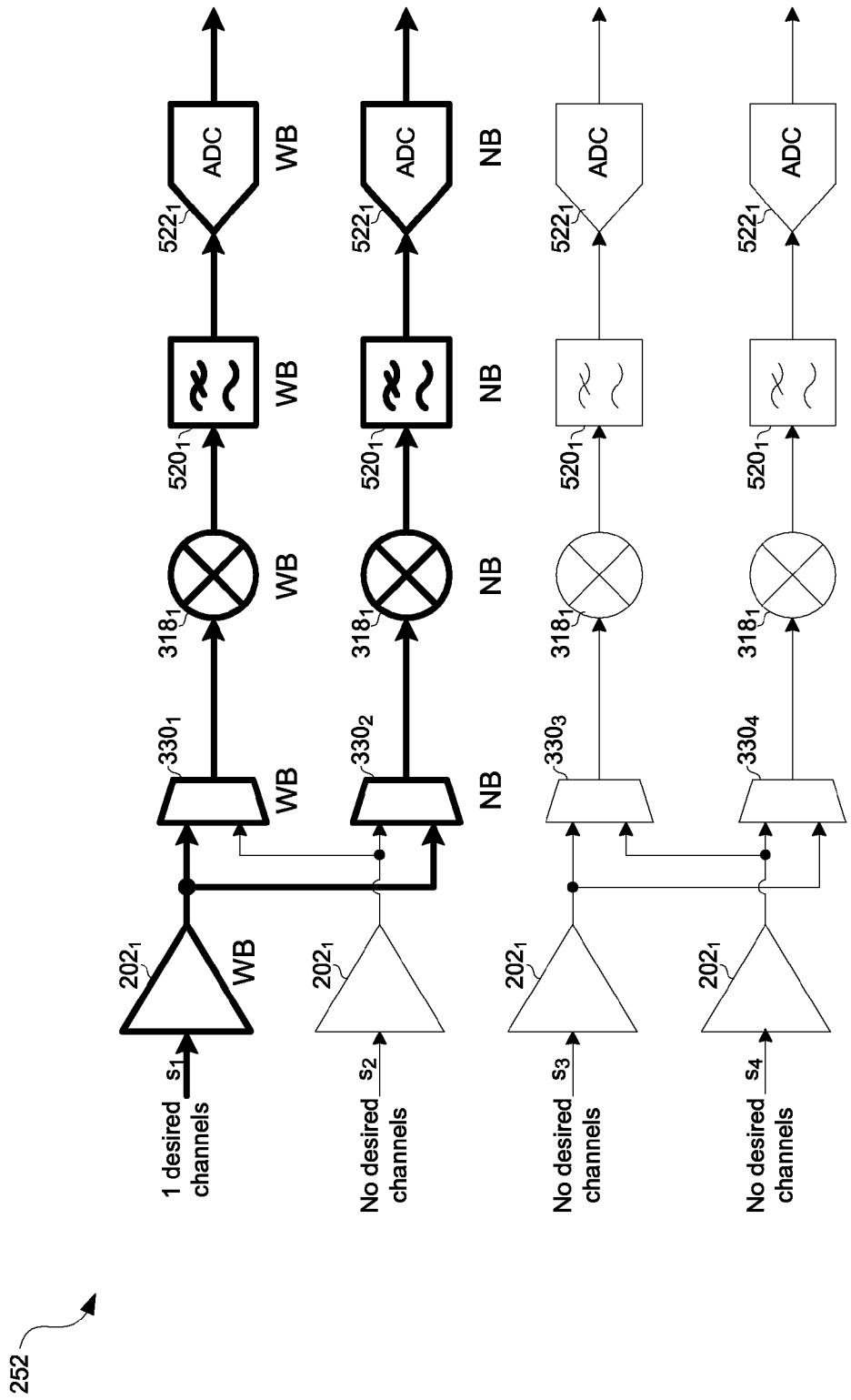
Figure 6D:
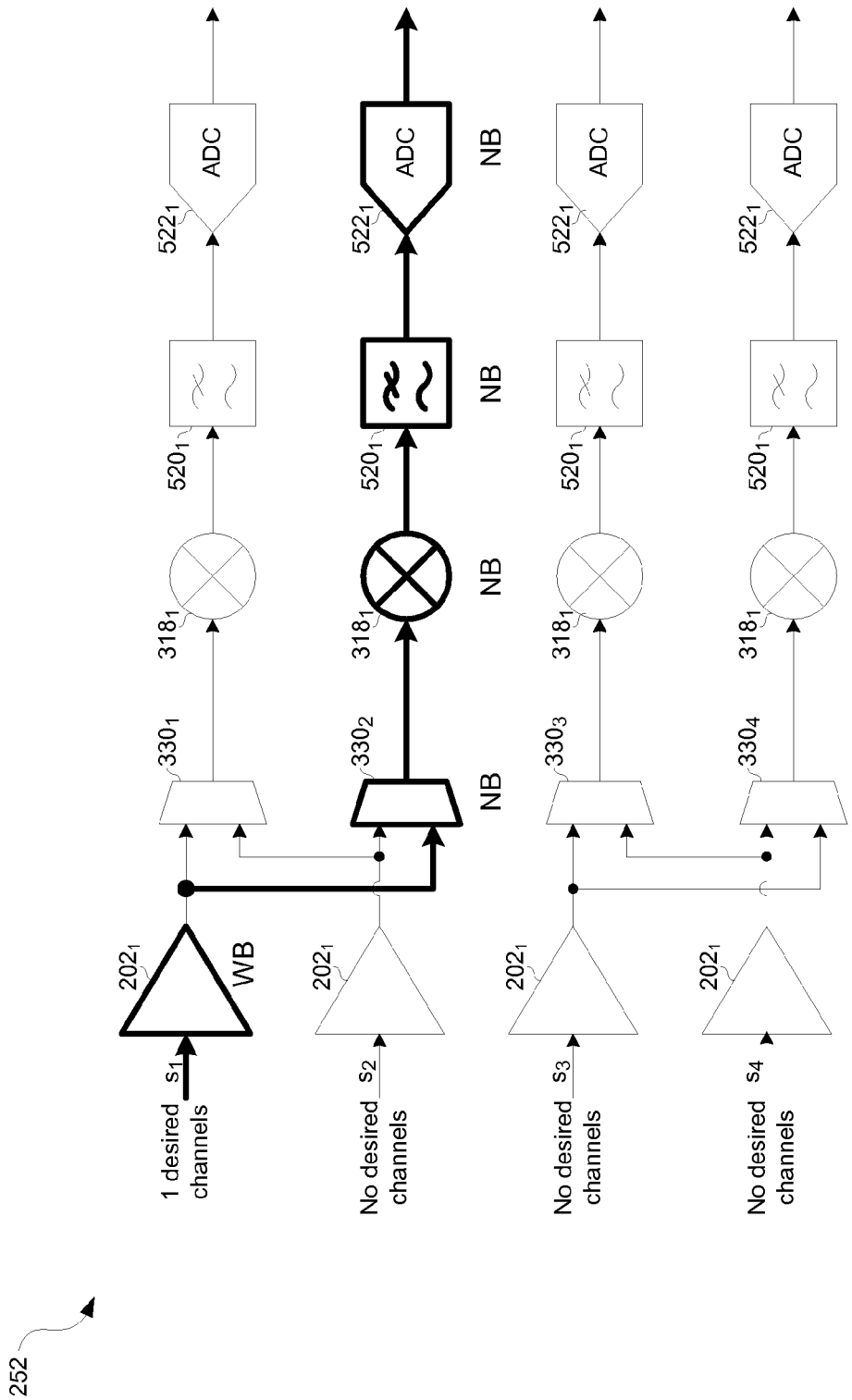

In FIG. 6B, the components 202$_1$, 318$_1$, 520$_1$, and 522$_1$ are configured into a wideband mode suitable for processing signal s$_1$ to enable recovering eight selected channels from the signal s$_1$. Then, in FIG. 6C, the network 100 may go from requesting the eight channels to requesting only one of the eight channels. As a result, it may be desirable to reconfigure the IF module 252 the components 202$_1$, 318$_1$, 520$_1$, and 522$_1$ into a narrowband mode to save power. Reconfiguring the components, however, may cause the signal at the network 100 to be temporarily disrupted. Accordingly, the IF module 252 may first configure the components 202$_2$, 318$_2$, 520$_2$, and 522$_2$ into a narrowband mode suitable for recovering the one selected channel, and may configure multiplexer 330$_2$ to select the output from amplifier 202$_1$. Once the components 202$_2$, 318$_2$, 520$_2$, and 522$_2$ have powered up and stabilized in the narrowband mode, the digital processing module may then seamlessly transition from receiving the selected channel via ADC 522$_1$ to receiving the selected channel via ADC 522$_2$. Then, in FIG. 6D, the components 318$_1$, 520$_1$, 522$_1$ may be powered down.

FIGS. 7A-7C illustrate exemplary embodiments of a digital processing module of an IP-LNB. The exemplary digital processing modules 254 shown in FIG. 7A-7C each comprise a channelizer 702, an interface 712 comprising a networking module 704, and an IF generation module 706. The exemplary digital processing module 254 in FIGS. 7B and 7C additionally comprises a demodulation module 708. The exemplary digital processing module 254 in FIG. 7C additionally comprises an error correction module 710.

The channelizer 702 may be operable to process the digitized signals d$_1$-d$_N$ (e.g., decimating and filtering such signals) such that it outputs the one or more channels of the digitized signals d$_1$-d$_M$ that have been selected for consumption. As such, the channelizer 702 may, for example, serve as a crossbar for selecting an arbitrary set of desired channels from among the channels available from one or more broadband sources.

The networking module 704 may be operable to receive digital signals, and transmit them over the link 108 in accordance with one or more networking protocols, such as MoCA and/or Ethernet.

The IF generation module 706 may be operable to receive digital signals, convert them to analog, and upconvert the analog signals to higher frequency. For example, the IF generation module 706 may upconvert the signals to L-band frequencies. In an exemplary embodiment, the IF generation module 706 may operate similarly to one or more of the upconverter modules 450, 650, 750 and DACs 470 and 670 described in the above-incorporated U.S. patent application Ser. No. 12/762,900.

The demodulation module 708 may be operable to receive the selected channels from the channelizer 702 and process the channels to recover the symbols modulated onto the channel.

The error correction module 710 may be operable to correct errors in data received from the demodulation module 708 utilizing one or more error correction algorithms (e.g., LDPC and/or Viterbi).

In operation, in FIG. 7A, the digitized channels output by the channelizer 702 may be transmitted onto the link 108 via the IF generation module 706 and/or via the network module 704. Transmission of the channels onto the link 108 via the IF generation module 706 may enable backward compatibility with customer premise equipment (e.g., gateway 102 and/or one or more devices of the LAN 104) that are configured to communicate with a conventional LNB, rather than the IP-LNB 122 described herein.

Transmission of the channels onto the link 108 via the networking module 704 may enable compatibility with other devices that support the networking protocol(s) in use. The embodiment shown in FIG. 7A may, however, utilize a large amount of bandwidth in the network since, for example, the channels may be digitized with more bits than necessary and at a faster rate than necessary in an attempt to minimize errors. Conversely, if the digitized channels are first demodulated, as in the embodiments shown in FIGS. 7B and 7C, less bandwidth may be required because some redundant information has been removed. Similarly, performing error correction, as shown in FIG. 7C, may remove additional redundant information and further reduce the data rate at which the data is transmitted onto the link 108. The amount of data to be transmitted via the networking module 704 could be further reduced by, for example, filtering out data that is not needed in the network 100. For example, MPEG packets not having a selected program ID.

By reducing the amount of data per-channel that needs to be transmitted via the networking module more channels can be transmitted onto the link 108. The number of channels that can be sent, however, is limited to the number of channels which are provided by the IF module 252. Accordingly, FIG. 8 illustrates an extensible embodiment of the IP-LNB 122.

Figure 8:
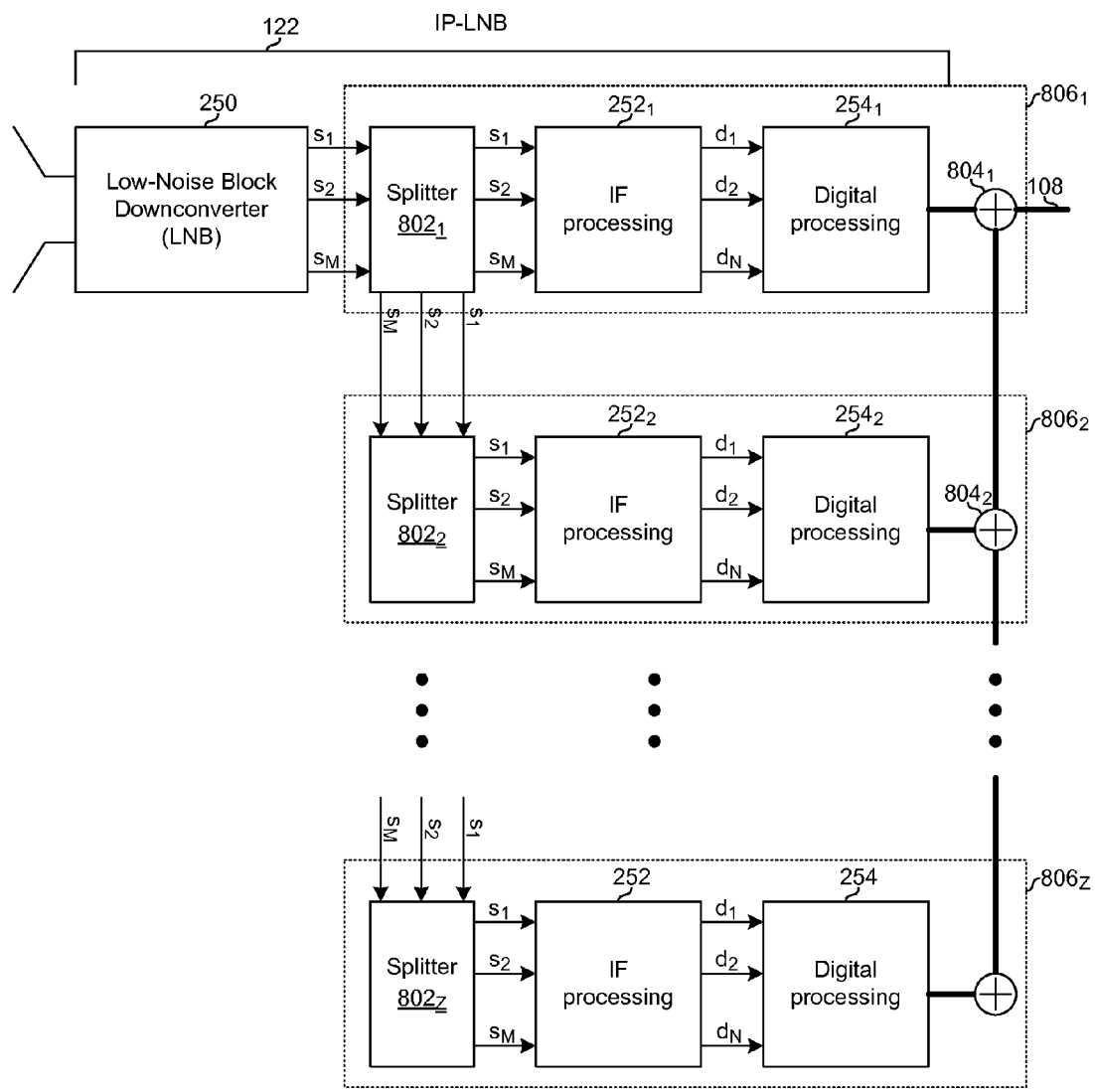
FIG. 8 illustrates an extensible IP-LNB architecture.

Referring to FIG. 8, there is shown modularized IP-LNB 122 comprising one or more modules 806, where each module comprises an IF processing module 252, a digital processing module 254, a splitter 802, and a combiner 804. In the IP-LNB 122 of FIG. 8, the number of channels that can be output on the link 108 is configurable by adding or removing modules 806.

In an exemplary embodiment, each of the modules $806_1$-$806_Z$ (where Z is an integer) may be realized on a single die. That is, Z modules 806 may correspond to Z dies, each die comprising a splitter 802, an IF processing module 252, a digital processing module 254, and a combiner 804. In another exemplary embodiment, each of the modules $806_1$-$806_Z$ (where Z is an integer) may be realized on multiple dies. For example, the IF module 252 and the digital processing module 254 may be integrated on a first die and the splitter 802 and combiner 804 may be discrete components and/or integrated on a second die. Other partitioning arrangements are of course possible.

In operation, it may be ensured that frequency bands on which the IF generation modules $706_1$-$706_Z$ of the modules $806_1$-$806_Z$ do not overlap such that there is no collisions on the link 108. Similarly, each of the networking modules $704_1$-$704_Z$ may be assigned a different network address to ensure that each networking module $704_1$-$704_Z$ is enabled to reliably communicate over the digital network.

In accordance with an exemplary embodiment of the present invention, one or more circuits (e.g., IF module 252) may comprise at least one first-type analog-to-digital converter (ADC) (e.g., ADC 222) and at least one second-type ADC (e.g., ADC 212). The one or more circuits may be operable to receive a plurality of signals (e.g., signals $s_1$-$s_M$), each of which may comprise a plurality of channels. The one or more circuits may be operable to digitize a selected one or more of the channels. Which, if any, of the selected channels are digitized via the at least one first-type ADC, and which, if any, of the selected channels are digitized via the at least one second-type ADC may be based on which of the plurality of channels are the selected channels (e.g., based on which, if any, of the selected channels are from signal $s_1$, which, if any, of the selected channels come from $s_2$, etc.).

A bandwidth of each first-type ADC may be on the order of a bandwidth of one of the plurality of received signals. For example, the bandwidth of each first-type ADC may be on the order of one GHz (e.g., 1.2 GHz). A bandwidth of each second-type ADC may be on the order of one of a bandwidth of one of the plurality of channels. For example, the bandwidth of each second-type ADC may be on the order of MHz (e.g., 6-45 MHz). The selected channels may comprise j channels from a first one of the plurality of signals, where j is an integer greater than or equal to 1. The j channels may be digitized via the at least one first-type ADC when j is less than a threshold. The j channels may be digitized via the at least one second-type ADC when j is greater than the threshold. The threshold may be determined based on power consumption of the one or more circuits.

The one or more circuits may comprise at least one first-type mixer (e.g., mixer 208) and at least one second-type mixer (e.g., mixer 218). The one or more circuits may be operable to downconvert the selected one or more channels. Which, if any, of the selected channels are downconverted via the at least one first-type mixer, and which, if any, of the selected channels are downconverted via the at least one second-type mixer may be based on which of the plurality of channels are the selected channels (e.g., based on which, if any, of the selected channels are from signal $s_1$, which, if any, of the selected channels come from $s_2$, etc.).

The one or more circuits may comprise one or more multiplexers for conveying one or more of the plurality of signals to the at least one first-type ADC and/or the at least one second-type ADC. Each of the plurality of signals may be a satellite television signal. The one or more circuits may be collocated with a satellite dish (e.g., dish 106). The one or more circuits may be integrated on a common substrate with a low-noise block downconverter (LNB) (e.g., LNB 250) of the satellite dish.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for an energy-efficient receiver.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
a satellite television receiver comprising a first amplifier, a plurality of signal processing paths, and a path selection circuitry, wherein:
said first amplifier is operable to amplify a band of frequencies of a signal from a first satellite television low-noise-block downconverter (LNB);
said band frequencies encompasses all satellite television channels which may be requested by one or more client devices served by said satellite television receiver;
a first one or more of said plurality of signal processing paths are operable to process only a portion of said band of frequencies;
a second one or more of said plurality of signal processing paths are operable to process all of said band of frequencies; and
said path selection circuitry is operable to select whether an output of said first amplifier is routed to said first one or more of said plurality of signal paths or to said second one or more of said plurality of signal paths.

2. The system of claim 1, wherein said selection is based on how many of said satellite television channels are requested by said one or more client devices.

3. The system of claim 2, wherein:
said path selection circuitry is operable to select said first one or more paths when less than a threshold number of said satellite television channels are requested by said one or more client devices; and
said path selection circuitry is operable to select said second one or more paths when greater than said threshold number of said satellite television channels are requested by said one or more client devices.

4. The system of claim 1, wherein:
each of said first one or more of said plurality of processing paths comprises a narrowband analog-to-digital converter; and
each of said second one or more of said plurality of signal processing paths comprises a wideband analog-to-digital converter.

5. The system of claim 1, comprising a wideband mixer, and a plurality of narrowband mixers.

6. The system of claim 5, wherein:
said output of said amplifier is downconverted by one or more of said narrowband mixers when said first one or more signal processing paths are selected; and
said output of said amplifier is downconverted by said wideband mixer when said second one or more signal processing paths are selected.

7. The system of claim 5, wherein:
said wideband mixer is part of said second one or more signal processing paths; and
said plurality of narrowband mixers are part of said first one or more signal processing paths.

8. The system of claim 5, wherein outputs of said wideband mixer and said plurality of narrowband mixers are inputs to said path selection circuitry.

9. The system of claim 1, comprising a second amplifier operable to amplify said band of frequencies of a signal from a second satellite LNB, wherein said path selection circuitry is operable to select whether an output of second amplifier is routed to said first one or more of said plurality of signal paths or to said second one or more of said plurality of signal paths.

10. The system of claim 1, wherein said band of frequencies spans from 950 MHz to 2150 MHz.

11. A method comprising:
in a satellite television receiver comprising a first amplifier, a plurality of signal processing paths, and a path selection circuitry:
amplifying, by said first amplifier, a band of frequencies of a signal from a first satellite television low-noise-block downconverter (LNB), wherein:
said band frequencies encompasses all satellite television channels which may be requested by one or more client devices served by said satellite television receiver;
a first one or more of said plurality of signal processing paths are operable to process only a portion of said band of frequencies; and
a second one or more of said plurality of signal processing paths are operable to process all of said band of frequencies;
selecting, by said path selection circuitry, whether an output of said first amplifier is routed to said first one or more of said plurality of signal paths or to said second one or more of said plurality of signal paths.

12. The method of claim 11, wherein said selecting is based on how many of said satellite television channels are requested by said one or more client devices.

13. The method of claim 12, comprising:
selecting, by said path selection circuitry, said first one or more paths when less than a threshold number of said satellite television channels are requested by said one or more client devices, and said second one or more paths when greater than said threshold number of said satellite television channels are requested by said one or more client devices.

14. The method of claim 11, wherein:
each of said first one or more of said plurality of processing paths comprises a narrowband analog-to-digital converter; and
each of said second one or more of said plurality of signal processing paths comprises a wideband analog-to-digital converter.

15. The method of claim 11, comprising a wideband mixer, and a plurality of narrowband mixers.

16. The method of claim 15, comprising:
downconverting said output of said amplifier using one or more of said narrowband mixers when said first one or more signal processing paths are selected; and
downconverting said output of said amplifier using said wideband mixer when said second one or more signal processing paths are selected.

17. The method of claim 15, wherein:
said wideband mixer is part of said second one or more signal processing paths; and
said plurality of narrowband mixers are part of said first one or more signal processing paths.

18. The method of claim 15, wherein outputs of said wideband mixer and said plurality of narrowband mixers are input to said path selection circuitry.

19. The method of claim 11, comprising:
amplifying, by a second amplifier, said band of frequencies of a signal from a second satellite LNB; and
selecting, by said path selection circuitry, whether an output of said second amplifier is routed to said first one or more of said plurality of signal paths or to said second one or more of said plurality of signal paths.

20. The method of claim 11, wherein said band of frequencies spans from 950 MHz to 2150 MHz.

* * * * *